United States Patent [19]
Thomas et al.

[11] Patent Number: 4,534,017
[45] Date of Patent: Aug. 6, 1985

[54] FET MEMORY WITH DRIFT REVERSAL

[75] Inventors: David R. Thomas, Lexington, Ky.;
Paul C. Tien, Redondo Beach, Calif.

[73] Assignee: International Business Machines Corporation, Armonk, N.Y.

[21] Appl. No.: 316,160

[22] Filed: Oct. 29, 1981

[51] Int. Cl.³ ............................................. G11C 11/24
[52] U.S. Cl. .................................... 365/149; 365/178; 365/222
[58] Field of Search ........................ 365/149, 178, 222

[56]     References Cited
       U.S. PATENT DOCUMENTS
  4,204,277  5/1980  Kinoshita .
  4,291,392  9/1981  Proebsting ........................... 365/203

Primary Examiner—James W. Moffitt
Attorney, Agent, or Firm—John A. Brady

[57]     ABSTRACT

In response to a periodic pulse on a lead (21) an FET (47) connected gate-to-drain is driven in a low current circuit, producing a threshold potential on node F. This is connected through switch FETs (61) to the word lines (1) of a memory. This holds the gates of memory access switches (5) at threshold. A higher voltage on the bit line (7) takes off charge in memory cells (40) which have drifted from zero charge stored toward the substrate voltage. Absence of the periodic signal activates an FET (59) which grounds node F. High voltage applied to a word line (1) switches off the FET (61) connecting that line to node F.

5 Claims, 2 Drawing Figures

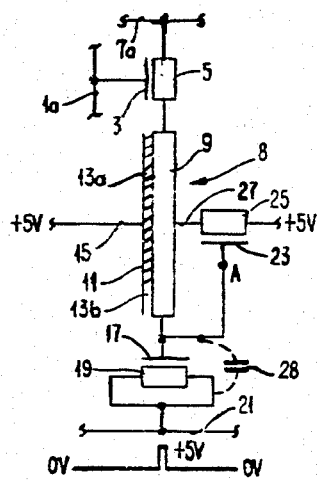
FIG. 1
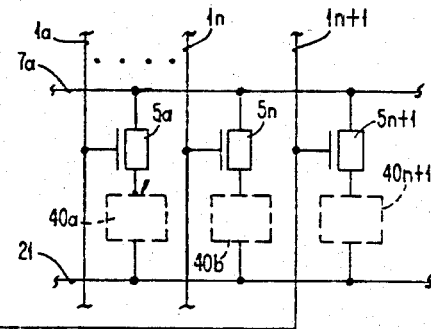
FIG. 2
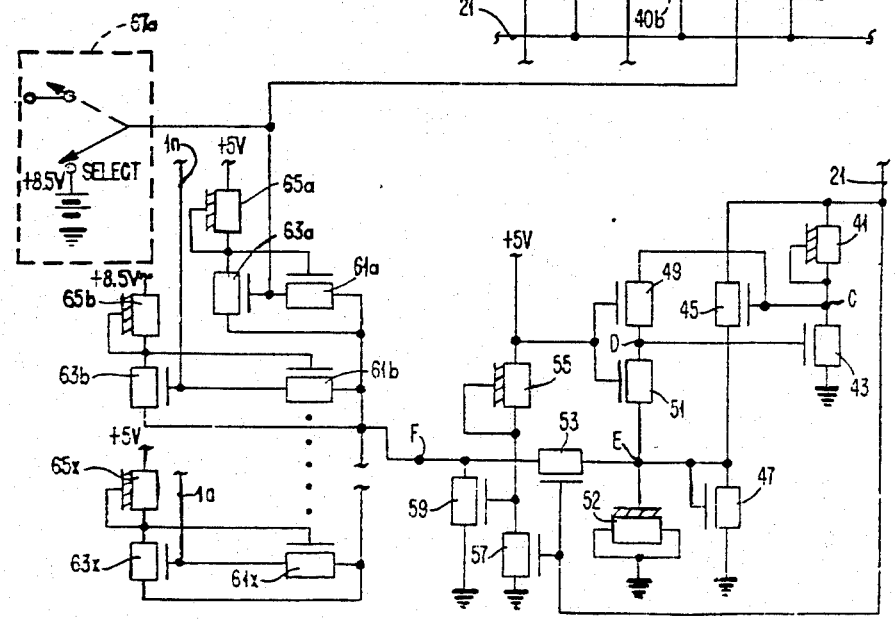

FET MEMORY WITH DRIFT REVERSAL

DESCRIPTION

Cross-Reference to Related Application in U.S. Pat. No. 4,430,730; Ser. No. 316,159 filed Oct. 29, 1981, the same date as this application by Paul C. Tien, a joint inventor of this application, entitled "FET Memory With Refresh," and assigned to the same assignee to which this invention is assigned, a circuit is described and claimed which is employed in the preferred embodiment here described. That subject matter is a capacitive cell and a multicell memory with refresh of loss of stored change by application of the operating voltage.

TECHNICAL FIELD

This invention relates to a multicell memory formed of field effect transistors (FETs) on a substrate, with each memory cell storing data as a capacitor. This invention is directed to the accurate continued storage and retrieval of data at the capacitive sites where stored low level or ground conditions tend to drift to a potential applied to the substrate. The memory has a generally typical matrix configuration with word or column line and row or bit lines, by which an access or switch FET is selected by driving a row line and a column line.

BACKGROUND ART

The problem of drift of the capacitive sites toward a substrate voltage level is not known to have been addressed in the prior art with circuitry to neutralize the problem. The problem is reduced when the sense time is short. Certain fabrication techniques eliminate the application of a voltage potential to the substrate, and that normally eliminates the drift. Where the problem eists and the drift not reversed, the drift is toward a status which turns on access-switch transistors to the memory cells. In time each cell originally storing ground potential has its access transistor biased near threshold. This seriously degrades the sensing operation during normal read and write, as the ground level memory cells after drift will pass charge from a sense line. In addition to draining charge, the access transistor also passes noise at every site at which drift to near threshold has occurred.

This invention reverses the drift by a circuit system which applies a threshold potential to the gate of the access tranistors while their drains are driven high to thereby take out the negative charge. The employment of a potential controlled to threshold is employed in a memory circuit in U.S. Pat. No. 4,204,277 to Kinoshita. This functions, however, to hold bit lines to a given level to reduce oscillations.

The drift toward substrate potential and its negative consequences is eliminated by a circuit design which is practical and need not require substantial power. Because of the low power requirements, the subject circuit is well suited to use a standby battery for automatic protection of information in memory during loss of power.

DISCLOSURE OF THE INVENTION

This invention employs means to bias the gates of all memory site selection-switch FETs on a word line to about a threshold above ground and to drive the bit lines high simultaneously between data sensing. This drives all the originally grounded storage points to ground. This preferably done briefly at clocked intervals. During read and write operations a higher signal is applied to the gates of the access transistors.

A preferred implementation is disclosed in which a periodic pulse operates on a feedback circuit which reaches voltage balance and thereby uses no substantial current. A transistor having the same threshold as that of the access transistor is connected with drain and source together to define the signal level applied to the gate of the access transistor. An FET grounds the output of the threshold potential source, but is switched off the periodic signal applied to the gate of an FET connected to the gate of the grounding FET.

BRIEF DESCRIPTION OF THE DRAWINGS

The details of this invention will be described in connection with the accompanying drawing, in which:

FIG. 1 is a circuit diagram with some suggestion of actual structure of one memory cell employed in the preferred embodiment disclosed;

FIG. 2 is a circuit diagram of the drift-reversal memory system in accordance with this invention.

BEST MODE FOR CARRYING OUT THE INVENTION

As the best mode known includes memory cells which have capacitive sites which are periodically refreshed when charged high, thereby negativing the drift opposite to substrate drift which capacitive memories normally would encounter, a somewhat detailed explanation of that memory cell and multicell memory is included here. That subject matter is described and claimed in the foregoing U.S. Pat. No. 4,430,730; application Ser. No. 316,159, filed concurrently with this application, with one of the two inventors of this application as the sole inventor thereof, and entitled "FET Memory With Refresh." It will be recognized that the type of capacitive memory employed is not fundamentally related to the functioning and potential employment of this invention.

FIG. 1 is a single memory cell which typically is part of a large random access memory connected conventionally in rows and columns, with each cell addressed by selection of one of a plurality of word lines and bit lines. Thus, word line 1a connects to the gate 3 of selection-switch FET 5 as well as to the gates of corresponding transistors in other rows. Bit line 7a connects to the drain of switch transistor 5, as well as to the drains of corresponding transistors in other columns.

The field effect transistors of this embodiment, whether structured as switches, voltage-activated capacitors, resistors, or capacitive data storage elements as will be described, are all of the metal oxide semiconductor field effect transistor type (MOS FET). Such transistors are now well known and employ metal oxide, here silicon dioxide, to achieve a gate region with impurities implanted in the metal oxide to achieve source and drain regions. The operative area under the gate between source and drain regions is the channel. As this embodiment may employ essentially generally known circuit fabrication technology, only those aspects unique to the invention or useful in describing it will be discussed in detail.

The source of switch transistor 5 is connected to a data storage FET 8 at one side of the channel region 9. The gate 11 of FET 8 has a large area 13a which is ion implanted to form a depletion-mode area. The part of channel 9 under the depletion-mode area 13a is that part connected directly to selection switch transistor 5. The other part of channel 9 is under a smaller, enhancement-mode area 13b.

The depletion-mode area 13a is achieved by a conventional technique of applying an ion implant in the desired pattern through the gate material. As with conventional depletion-mode devices, the channel under depletion-mode area 13a is rendered conductive by a voltage on the gate 11 which is less than the zero or ground potential of the system. In this preferred device the operating potential at most inputs is +5 volts. The depletion-mode area 13a will render the associated part of channel 9 conductive at voltage differences of −2 volts and above between gate 11 and the channel 9. Specifically, the depletion-mode area 13a induces conductivity when a zero voltage difference is applied between gate 11 and the voltage from switch transistor 5.

The transistor portion with enhancement-mode area 13b functions conventionally as an enhancement-mode device. To render the portion of channel 9 under area 13b conductive, a threshold voltage difference must be achieved, in this embodiment of about +1 volt.

Gate 11 is connected on lead 15 to a constant source of +5 volt operating potential, which in the event of failure of central power preferably may be a small, inexpensive storage battery. The end of channel 9 away from selection switch transistor 5 is connected to the gate 17 of transistor 19, which is an enhancememt-mode device with source and drain connected together. FET 19 therefore functions, as is well known, as a capacitor. The channel side of FET capacitor 19 is connected to line 21, which is normally at ground potential but periodically receives a +5 colt refresh signal (V Ref).

The electrical region including the gate 17 and the channel under gate 13 b is denominated for convenience as node A. Node A includes a connection to gate 23 of refresh switch transistor 25. An inherent or parasitic capacitance 28 exists between the the channel side of FET capacitor 19 and node A.

Refresh transistor switch 25 is an enhancement-mode device with its drain connected to a constant source of +5 operating potential, which in the event of failure of central power preferably may be the storage battery. The source of FET 25 is connected on lead 27 to the part of channel 9 of the data storage transistor 8 under depletion-mode region 13a.

As is conventional, the circuit is fabricated on a single layer of semiconductive material termed the substrate. The substrate is isolated from the FET elements fashioned upon it by the junction effects of impurities and the like implanted in and above the substrate. To assure positive isolation of the substrate, it may be electrically biased. In this particular embodiment the substrate is connected to a source of −1.5 volts. In most circuit operations, the effects of the substrate are so small as to be negligible. Here, however, the capacitance effect between the channel 9 and the substrate is significant.

In operation the memory cell is selected for the writing and reading of data by driving the word line 1a and the bit line 7a. Word line 1a is driven to +8.5 volts. During a writing operation, bit line 7a will be brought either to +5 volts or to ground. The signal on word line 1a gates on FET 5. When bit line 7a is at ground or zero volts, any charge on storage FET 8 and capacitor 19 is drained off until the potential at gate 17 of capacitor 19 drops to the threshold, +1 volt. At this point capacitor 19 is switched off. Further current flow is in a capacitive fashion between the circuit substrate and channel 9. All of channel 9 is conductive because the +5 volts on lead 15 and the zero volts on channel 9 from bit line 7a substantially exceed the threshold of both depletion-mode region 13a and enhancement-mode region 13b. At equilibrium channel 9 is at zero potential. The input signal from transistor 5 is switched off.

This state of charge of FET 8 represents a bit of data, which may arbitrarily be considered a zero bit rather than a 1 bit. As it is characterized by an absence of stored charge, there is little tendency of the charge to drift toward a higher level. Accordingly, no need exists to refresh the cell with another zero potential input to channel 9 to counter a drift toward a higher level. The possibility of drift toward a lower level is discussed below.

The signal on line 21 is held at ground during the writing operation. At periodic intervals subsequently line 21 receives a refresh pulse, V Ref, of +5 volts. The circuit responds automatically to reject that pulse and continue the stored status of data. This occurs because capacitor 19 is discharged to a potential insufficient for gate 17 to switch capacitor 19 on. Since FET 19 is thereby deactivated as a capacitor, V Ref is blocked by FET 19, FET 25 is not switched on, and the conditions of FET 8 and FET 19 are not altered by either V REF or the +5 V source through FET 25.

To write a 1 bit into the memory cell, word line 1a is again driven to +8.5 volts while bit line 7a is brought to +5 volts. Storage FET 8 is gated on by the constant +5 V operating potential source on lead 15. The five volt signal on line 7a passes through FET 8 to gate on FET 19 and FET 19 begins to charge it as a capacitor.

When the potential at gate 17 of FET 19 reaches +4 volts, the voltage from gate 11 of FET 8 at the enhancement-mode region 13b has reached threshold and the part of channel 9 under that region is switched off.

Further current flow is in a capacitive fashion between substrate of FET 8 and the part of channel 9 under depletion-mode region 13a. At equilibrium a positive static charge of +5 volts accumulates on that part of channel 9 under depletion mode region 13a. The input signal from transistor 5 is switched off.

This state of charge of FET 8 represents a 1 bit of data. It is characterized by an accumulation of charge on FET 8. Since it is static potential above ground, charge is gradually lost by inherent leakage effects. Accordingly, a need exists to periodically refresh the cell before the information represented by the charge is lost.

The signal on line 21 is held at ground during the writing operation. At periodic intervals subsequently line 21 receives a refresh pulse, V Ref, of +5 volts. When a cell is storing the +5 volt change, which has typically decayed to about +4.75 volts, the circuit responds automatically to pass V Ref to gate 23 of FET 25, at which it is effective to switch on FET 25. This applies the steady +5 volt operating potential at the drain of FET 25 to channel 9 on lead 27.

This occurs because FET 19 is still charged near four volts. That potential gates FET 19 on as a capacitor and is at a high level such that the added potential of V Ref and the potential on FET 19 combine to reduce the gate-to-source voltage to below threshold of the enhancement-mode region 13b of transistor 8. The part of channel 9 at node A therefore becomes non-conductive and the V Ref signal does not pass into FET 8. Instead, this combined voltage (such combined voltage is often referred to as a bootstrap voltage) is applied to gate 23 of FET 25 at a level above +5 volt plus a threshold, gating on FET 25.

The +5 volt operating potential gated through FET 25 to line 27 is connected to a conductive part of channel 9. A recharging to +5 volt in a capacitive fashion between the substrate and channel 9 once again takes place. This refreshes the charge on channel 9 to +5 volts.

The combining of regions 13a and 13b under the same gate 11 and the connection of FET 25 directly to drain 9 will be recognized as design details in fabrication giving a compact structure. The circuit as described would be substantially the same functionally and in design concepts if regions 13a and 13b were in separate FETs, each with separate sources and drains. Similarly, FET 25 could connect to the channel of the depletion region 13a through the source or drain of the FET having region 13a, rather than directly to channel 9.

Each of thousands of memory cells as described may be in an array on the same substrate and each receives the V Ref signal simultaneously. Many or even all of the cells could be at the +5 volt change status. Accordingly, if this curcuit design did not provide for the blocking of V Ref from flowing into FET 8, a pulse source for V Ref capable of delivering variable, very high currents as demanded would be required. The circuit described requires very little current for V Ref.

The source of V Ref is accordingly not critical nor a necessary part of the best mode of this invention. A preferred multivibrator circuit, since it is inexpensive and has low-power requirements, is described and hereby incorporated by reference in U.S. Pat. No.4,410,862; Ser. No. 262,728 by Paul C. Tien, one of the two joint inventors of inventor as this application, filed May 12,1981, entitled "MOSFET Multivibrator With Dual Timing, " and assigned to the same assignee to which this invention is assigned. Timing of a typical, preferred refresh-signal (V Ref) multivibrator will provide a pulse of 400 nanoseconds at regular intervals of 1.6 millisecond.

In fabrication, switch FETs 5 and 25 are typically of small area, while the depletion-mode area of FET 8 is relatively large in area, to provide increased capacitance. Similarly, FET 19 has a large area, which increases capacitance.

Memory cells as in FIG. 1 are duplicated on the same substrate in a repetitive pattern which extends both horizontally and vertically to form a random access memory of thousands of cells. Operation as described from a V Ref signal with ground or no charge stored in FET 8 could be imparied by parasitic capacitance 28 around FET 19. That is inherent and results primarily from imperfect diffusion of impurities forming the source and drain of FET 19. If capacitance 28 conducts sufficient voltage from V Ref to FET 25 to switch it on, the charge stored will incorrectly be brought to +5 volts. The voltage transmitted, by standard circuit analysis, is the product of the voltage applied, V Ref, times the ratio of capacitance of capacitor 28 divided by that capacitance plus the capacitance in the remaining series capacitance. The remaining series capacitance is the capacitance from node A forward. It includes the parasitic capacitance of FET 8, a large element with correspondingly large parasitic capacitance. Accordingly, in the typical circuit capacitance 28 would not transmit V Ref in an amount sufficient to turn on FET 25. If necessary, the gate of FET 25 could be made longer and narrow to reduce its response to such a signal transmitted by parasitic capacitance 28.

The preferred form disclosed, as mentioned, employs a substrate potential past ground, specifically at −1.5 volts. This is required for certain fabrication technologies. In accordance with this invention the following circuit system is provided to reverse drift of the status of memory sites toward that negative potential.

FIG. 2 illustrates a row of cells as described in the foregoing, denominated cell 40a cell 40n+1, which are substantially identical as described in connection FIG. 1. Cell 40a has a selection FET 5a, cell 40n+1 has FET 5n+1, each of which corresponds to FET 5 of FIG. 1. A bit line 7a connects to the drain of all of the selection transistors. Word line 1a connects to the gate of FET 5a, with corresponding lines for the other selection transistors, including word line 1n+1 for FET 5n+1. The memory has the standard arrangement of other rows of cells (not shown) each having a different bit line and each controlled by one of the word lines, including lines 7a through 7n+1 (not shown).

One row of storage sites addressed by a bit line, such as bit line 7a, produces a combined detrimental effect resulting from a drift toward the substrate voltage. This is cumulative from each cell in a row in which a zero potential is stored. Between access operations each such cell is isolated by lowering all the word lines 1 to ground. Typically the bit line 7 of each row is also brought to ground.

Inherent leakage in response to the effect of the −1.5 substrate voltage will move the cell potential from ground to a minus level at each cell originally storing ground potential. That drift will continue until the associated selection transistor 5 reaches threshold and turns on or until current induced by a near threshold level equals the leakage current of the memory cell. As described above, the periodic refresh signal on line 21 to FET 19 has no effect on a ground status, and that functioning is the same for a status below ground.

Accordingly, in time each cell originally storing ground potential has its access FET 5 at threshold or sub-threshold.

While this presents no problem at other times, it can seriously degrade the sensing operation during normal read and write in which the bit line 7 is brought high.

During such sensing all of the original ground-level cells after drift will rob charge from the bit line 7. This will tend to lower the potential on bit line 7 and degrade proper sensing of a selected cell which stores a high charge, as that is properly responded to by the bit line not losing potential.

This problem could be minimized by keeping sense time short so the leakage current could only produce a negligible shift. Related problems would be still present. Noise present in the non-selected cells will propagate to the bit line 7 since the access FETs 5 will not be completely turned off. Battery or power supply signals, signals on line 21 and on the word line 1, and ground noises will all propagate through the FET 5 which is not fully off. The magnitude of this noise is multiplied by the number of non-selected cells. The worst case is X−1, where X is the number of cells on a bit line 7.

To eliminate the effect of such drift to the substrate voltage, at times other than reading and writing the word lines 1 are brought to a threshold above ground while the bit lines are driven higher. Specifically, word lines 1 are pulsed to the potential at the same time line 21 is pulsed to refresh positively charged cells.

Because a brief action period is employed, the reference-voltage source provided is one which is dynamic and which utilizes very little power. While consuming very little average power, it also provides low internal resistance by employing large devices that conduct only during a small interval in time. The large devices with small internal resistance hold word lines 1 at the desired voltage more accurately in the presence of external electrical noise.

As illustrated schematically in FIG. 2, this dynamic voltage generator to provided a voltage slightly below threshold for FETs 5 comprises depletion-mode FET 41, connected gate-to-source so as to function as a resistance. This connects to node C, which connects to the drain of FET 43, the source of which is connected to ground.

In parallel with FETs 41 and 43 is a series connection to ground of FETs 45 and 47. Node C connects to the gate of FET 45 and to the drain of FET 49. The source of FET 49 is connected to node D, which is connected to the gate of FET 43 and the drain of FET 51. The source of FET 51 connects to node E.

Node E connects to the gate of FET 47, and to the gate of depletion-mode FET 52, connected source-to-drain, so as to function as a capacitor. The other side of FET 52 is connected to ground. Node E also connects to the drain of FET 53.

A +5 source of operating potential is connected to the drain of depletion-mode FET 55 and to the gates of FETs 49 and 51. FET 55 is connected gate-to-source to act as a resistance, and that side is connected to the drain of FET 57 and to the gate of FET 59.

The drain of FET 59 is connected to node F. The sources of FETs 57 and 59 are connected to ground. Node F is connected to the source of FET 53 and to a line-select circuit comprising switching FETs 61a through 61x, one for each word line. The source of each FETs 61 is connect to node F. The drain of each FET 61 is connected to one word line 1. The drain of FET 61a is connected to word line 1n+1. The drain of FET 61b is connected to word line 1n, and so on.

The drain of each FET 61 is connected to the gate of a FET 63. FET 61a is connected to the gate of FET 63a. FET 61b is connected to the gate of FET 63b, and so on.

Each FET 63 is connected to the +5 volt operating potential, through an FET 65 connected as a resistance.

Each word line 1 has a decoder switch 67, shown illustratively in FIG. 2 as 67a because it selects the line associated with FET 61a. The switch, such as switch 67a, may be a FET switch selectable by appropriate logic to either connect a source of +8.5 volts on line 1n+1 or, in the non-select status, to apply an open circuit to line 1n+1.

Line 21 is the controlling signal to this preferred circuit, as well as providing the refresh signal to the memory cells as described, since the low cost, energy-efficient circuit employed is also well suited to drive this circuit. Line 21 connects to the drains of FETs 41 and 45 and to the gates of FETs 53 and 57.

In operation, before line 21 goes high, node C is initially low since a path exists to line 21 through depletion-mode FET 41. Similarly, nodes D and E will be low since they have paths to node C through FET 51 and FET 49.

FETs 49 and 51 act as a resistor divider. By direct computation, voltage node D equals voltage node E plus the quantity voltage node C minus voltage node E times the ratio of resistance of FET 51 times the sum of the resistances of FET 51 and FET 49 (VnodeD=VnodeE+((VnodeC−VnodeE)×(RFET51/RFET51+RFET49))).

Line 21 is at 0 volts with periodic pulses to V Ref of +5 volts as described above. When line 21 goes high, node C will begin to follow it. Node E will initially stay low since there is significant capacitance on node E and the only charge-up path is through FET 49 and FET 51. Node D will start going high. When node C reaches the threshold voltage of device FET 45, it will start conducting, raising the potential of node E. Node E will rise in voltage until it causes node D to rise above the threshold of device FET 43. When FET 43 starts conducting it will stabilize the rising potential of node C at approximately twice the threshold voltage of the FETs.

The circuit now acts as a closed-loop system. A decrease in node E potential will cause node D to decrease. A node D decrease means less overdrive for device FET 43, which allows node C to rise. The rise causes FET 45 to have more overdrive, tending to raise the potential of node E.

An increase in node E potential will cause node D to increase. A node D increase means more overdrive for device FET 43, which pulls node C lower. The decreased overdrive of FET 45 will mean less current is supplied to node E. The voltages are balanced, and no substantial current flows.

FET 47 starts conducting where the voltage on node E rises above its threshold. This effectively clamps the maximum voltage on node E to the threshold of FET 47. Before this clamping action takes place, FET 45 will have been cut off by the feedback action explained in the previous paragraph, thus preventing any DC current from line 21 to ground through the relatively large (low resistance) devices FET 45 and FET 47. The clamp prevents noise transients external to the reference circuit from raising node E potential signficantly. FET capacitor 52 is included to prevent oscillation.

The reference equilibrium voltage is adjustable by changing the resistor ratio. Increasing the resistance presented by FET 51 (decrease channel width or increase length) while holding FET 49 constant will lower the equilibrium voltage. Likewise an increase in the resistance of FET 51 will raise the reference voltage. Conversely the resistor ratio can be changed by adjusting the length and width of FET 49. The resistor ratio is varied to achieve the desired equilibrium voltage value. Consequently, the voltage at node E can be settled at the level slightly below a transistor threshold voltage shortly after line 21 reaches its peak value.

As line 21 is pulsed to its high level, the source of FET 55 is discharged to ground, turning off FET 59 and turning on hard FET 53. Node F is charged to the subthreshold level at node E. Each FET 61 is gated on through the FET 65 associated with it. Each word line 1 is charged to the node E through the associated FET 61.

The clock signal on line 21 is then pulsed to ground level, turning off FETs 53 and 57. FET 59 is then gated on through FET 55, discharging the node F as well as all word lines to ground. This completes the activities for ground clamp for all "zero charge level memory" sites and effectively isolates all non-selected cells from the bit lines 7.

During a read and write cycle, line 21 stays at ground level. Node F is held at ground level as stated in the previous paragraph. Where a word line 1 is selected by its associated word line decoder 67 (word line 1n+1 and associated decoder 67a appear as an example in the drawing), that word line is charged to the high, +8.5 volt, charge level. The +8.5 volt level on line 1 is also conected to the gate of the associated FET 63. That connects node F to the gate of the associated FET 61, turning it off and thereby disconnecting the associated word line 1 from the ground at node F. The selected word line 1 is then free to go to 8.5 volts to perform the cell select. The deselected word lines 1 will be held at ground through node F because all of the other FETs 61 are still heavily turned on.

It will be apparent that the invention here described can take various forms and is subject to modifications and possible future improvements, all within the spirit and scope of the contributions here described. Patent protection therefore should not be limited to the preferred embodiment described.

What is claimed is:

1. A memory having capacitive sites to be selectively charged to store bits of data,
    a plurlity of first field effect transistors, each connected as a switch and having a first terminal and a second terminal with connection between said terminals controlled by a gate, said first terminal of each of said first transistors being connected to different ones of said sites,
    means connecting said gates of said first transistors to a first source of potential, said first source of potential being above ground in an amount substantially equal to the threshold of said first transistors, said threshold being a substantial potential between said gate and said first terminal which just renders each said first transistor conductive between said first terminal and said second terminal,
    means connecting said second terminal of said first transistors to a second source of potential, said second source of potential being above ground in an amount substantially above said threshold, and
    means to selectively connect a third source of potential to the gates of said first transistors, said third source of potential being substantially above said threshold to effect reading of the charge status of one of said capacitive sites.

2. The memory system as in claim 1 comprising a first circuit, said first circuit being responsive to periodic input pulses to produce said first source of potential at periodic intervals in response to said input pulses.

3. The memory system as in claim 2 in which said first circuit between said input pulses produces a fourth source of potential, said fourth source of potential being substantially below said threshold to gate said first transistors off, said memory system also comprising a plurality of switch means responsive to switch off in response to the said connection of said third source of potential, each said switch means normally connecting the gate of a different one of said first transistors to said first circuit and being connected to switch said first circuit out of said connection with the gate of each of said first transistor when said switch means is connected to the third source of potential to which the switch means responds.

4. The memory system as in claims 2 or 3 in which said first circuit is adapted and arranged to operate at voltage balance with no substantial current and comprises a second field effect transistor having substantially the same threshold as said threshold of said first transistors, said second transistor having its drain and gate electrically connected, a voltage divider circuit with an intermediate point connected to the gate of a third field effect transistor, means connecting the drain of said third transistor to one end of said voltage divider circuit and connecting the drain and gate of said second transistor to the other end of said voltage divider circuit, and means to connect said periodic input pulses to the drain of said third transistor and through a current regulating element to the drain and gate of said second transistor, the drain and gate of said second transistor being connected to substantially define the output level of said first circuit.

5. The memory system as in claim 4 also comprising an operating potential source, a fourth field effect transistor connected with one terminal in circuit with the drain and gate of said second transistor and its gate connected to said operating potential source, a fifth field effect transistor with its drain connected to the gate of said fourth transistor and its source connected to ground, and means to connect said periodic pulses to the gate of said fifth transistor, said circuit being adapted and arranged so that said operating potential source will gate on said fourth transistor to apply substantial ground level as the output level of said first circuit when said fifth transistor is gated off and periodic pulses which gate on said fifth transistor will cause said fourth transistor to be gated off.

* * * * *